United States Patent [19]
Kim

[11] Patent Number: 6,001,685
[45] Date of Patent: Dec. 14, 1999

[54] METHOD OF MAKING A SEMICONDUCTOR DEVICE

[75] Inventor: Jae Kap Kim, Kyoungki-do, Rep. of Korea

[73] Assignee: Hyundai Electronics Industries Co., Ltd., Kyoungki-Do, Rep. of Korea

[21] Appl. No.: 08/695,298

[22] Filed: Aug. 9, 1996

Related U.S. Application Data

[62] Division of application No. 08/359,588, Dec. 20, 1994, Pat. No. 5,569,948.

[30] Foreign Application Priority Data

Dec. 21, 1993 [KR] Rep. of Korea ............ 93-28885

[51] Int. Cl.$^6$ ............................................. H01L 21/8242
[52] U.S. Cl. .................... 438/253; 438/197; 438/199; 438/238; 438/652; 438/657; 438/634; 438/684; 438/671; 438/672
[58] Field of Search .................... 438/253, 652, 438/657, 634, 684, 671, 672, 197, 199, 238

[56] References Cited

U.S. PATENT DOCUMENTS

| | | | |
|---|---|---|---|
| 4,874,493 | 10/1989 | Pan | 438/672 |
| 5,063,169 | 11/1991 | De Bruin et al. | 438/652 |
| 5,084,403 | 1/1992 | Matsuoka | 438/652 |
| 5,358,902 | 10/1994 | Verhaar et al. | 438/672 |
| 5,461,004 | 10/1995 | Kim | 438/671 |
| 5,476,805 | 12/1995 | Woo et al. | 438/253 |
| 5,545,581 | 8/1996 | Armacost et al. | 438/672 |
| 5,591,673 | 1/1997 | Chao et al. | 438/672 |
| 5,763,324 | 6/1998 | Nogami | 438/675 |

FOREIGN PATENT DOCUMENTS

4028488 A1 3/1991 Germany.

OTHER PUBLICATIONS

1992, Toru Kaga, et al.; "Crown–Shaped Stacked–Capacitor Cell for 1.5–V Operation 64–Mb DRAM's"; *Transactions on Electron Devices*; Feb. 1991; vol. 38, No. 2, pp. 255–260.
1990, IBM Technical Disclosure Bulletin, vol. 33, No. 2, Jul. 1990; pp. 245–247.

*Primary Examiner*—John F. Niebling
*Assistant Examiner*—Lynne A. Gurley
*Attorney, Agent, or Firm*—Merchant & Gould P.C.

[57] ABSTRACT

A method of making a semiconductor device having a structure capable of obtaining an increased alignment margin for a mask without any increase in the area of the semiconductor device is shown by forming a contact plug on a drain while forming a contact pad on a source, without forming contact plugs on both the source and the drain in a simultaneous manner. The contact pad has an upper portion partially overlapping with a portion of an insulating film surrounding a contact hole in which the contact pad is buried. Accordingly, it is possible to easily carry out the contact process.

7 Claims, 15 Drawing Sheets

METHOD OF MAKING A SEMICONDUCTOR DEVICE

This is a Divisional of application Ser. No. 08/359,588, filed Dec. 20, 1994, now U.S. Pat. No. 5,569,948 which application(s) are incorporated herein by reference.

BACKGROUND OF THE INVENTION

1. Field of the Invention

The present invention relates to a semiconductor device and a method for fabricating the same, and a semiconductor device provided with a contact pad and a contact plug respectively formed on a source and a drain of a metal oxide semiconductor field effect transistor (MOSFET) and adapted to bring the source and drain into contact with conduction layers, and a method for fabricating the semiconductor device.

2. Description of the Prior Art

For obtaining a semiconductor device with a higher integration degree, generally, patterns of the semiconductor device are formed to have minimum pattern spaces by a lithography process. In this case, however, the semiconductor device involves an increased topology inevitably.

Such an increased topology results in an increase in aspect ratio of a contact hole subsequently formed to bring a conduction layer into contact with a semiconductor substrate of the semiconductor device. This causes problems of poor step coverage of the conduction layer being in contact with the semiconductor substrate and an increase in contact resistance.

In order to solve such problems, there have been proposed techniques of provision of a contact plug formed by burying the conduction layer in a lower portion of the contact hole and formation of a contact pad being in contact with the semiconductor substrate.

These conventional techniques will now be described in conjunction with FIG. 1 and FIGS. 2A to 2F.

FIG. 1 shows a layout of a MOSFET with a conventional contact structure. In FIG. 1, the MOSFET structure is shown in symmetry to its drain. As shown in FIG. 1, the MOSFET includes an active mask 50, a word line mask 52, a source/drain contact mask 54, a drain contact mask 56, a first conduction wiring mask 58 and a source contact mask 60.

FIGS. 2A to 2F are cross-sectional views respectively taken along the line X–X' of FIG. 1, showing a conventional method for forming contact plugs respectively on a source and a drain of the MOSFET structure shown in FIG. 1 and forming a conduction layer to come into contact with the contact plugs.

In accordance with this method, first, an insulating film 2 for an element isolation is formed on a predetermined portion of a semiconductor substrate 1, as shown in FIG. 2A. On the other portion of the semiconductor substrate 1, a MOSFET is then formed to include a gate oxide film 3, gate electrodes 4, a source 6 and a drain 6'. Thereafter, an insulating film 5 and insulating film spacers 7 are formed on the upper surface and side surfaces of each gate electrode 4, respectively. The insulating film 5 is comprised of an oxide film.

A thin oxide film 8 is then formed on the exposed source 6 and drain 6', as shown in FIG. 2B. Over the entire exposed surface of the resulting structure, a first insulating film 10 for planarization is formed. The first insulating film 10 is comprised of, for example, a borophosphosilicate glass (BPSG) film. Using a source/drain contact mask such as the mask 54 of FIG. 1, a formation of a photoresist film pattern 11 is then carried out.

Using the photoresist film pattern 11 as a mask, exposed portions of the first insulating film 10 are then subjected to an etch, as shown in FIG. 2C. Subsequently, the thin oxide film 8 exposed after the etching of the first insulating film 10 is anisotropically etched, thereby forming contact holes 19 through which the source 6 and the drain 6' are exposed, respectively. The contact holes 19 are formed in a self-aligned manner by virtue of the insulating spacers 7. Thereafter, the photoresist film pattern 11 is removed. Over the entire exposed surface of the resulting structure, a conduction layer 12 is formed to a sufficient thickness so that it is buried in the contact holes 19.

Subsequently, the conduction layer 12 is fully etched until the upper surface of the first insulating film 10 is exposed, as shown in FIG. 2D. As a result, the remaining portions of the conduction layer 12 form contact plugs 12' respectively buried in the contact holes 19.

Over the entire exposed surface of the resulting structure, a second insulating film 14 is then formed to a predetermined thickness, as shown in FIG. 2E. Thereafter, the second insulating film 14 is subjected to an etch process using the drain contact mask such as the mask 56 of FIG. 1 so that the contact plug 12' being in contact with the drain 6' is exposed. Over the entire exposed surface of the resulting structure, a first conduction layer is deposited. The first conduction layer is then subjected to an etch process using a first conduction wiring mask such as the mask 58 of FIG. 1, thereby forming a first conduction wiring 15. Since the second insulating film 14 has a small thickness, it is not short-circuited with the gate electrode 4 even at a misaligned state of the first conduction wiring mask.

A third insulating film 16 is then formed over the entire exposed surface of the resulting structure, as shown in FIG. 2F. Using the source contact mask such as the mask 60 of FIG. 1, the third insulating film 16 is then etched so as to expose the contact plug 12' being in contact with the source 6. Thereafter, formation of a second conduction wiring 17 is carried out. By referring to FIG. 2F, it can be found that the second insulating film 10 and the first insulating film 5 disposed on each gate electrode 5 have been partially etched at the step of etching the insulating film 16 due to the source contact mask misaligned to the right, thereby causing the second conduction wiring 17 to be short-circuited with the gate electrode 4.

In accordance with the conventional method, such an undesirable short circuit phenomenon may occur easily because of small alignment margins of masks respectively given upon forming the contact plugs on the source and drain and forming the conduction layer patterns being in contact with the contact plugs.

In order to prevent such short circuit phenomenons from occurring upon forming contacts on the source and drain, the design of a semiconductor device should be made, taking into consideration a printing registration and a variation in critical dimension occurring upon fabricating a contact mask, a misalignment tolerance, a lens distortion and a variation in critical dimension occurring upon forming a pattern on a wafer. However, this results in an increased area of the semiconductor device.

SUMMARY OF THE INVENTION

Therefore, an object of the invention is to solve the above-mentioned problems encountered in the prior art and, thus, to provide a semiconductor device having a structure capable of obtaining an increased alignment margin for a mask without any increase in the area of the semiconductor device by forming a contact plug on a drain while forming a contact pad on a source without forming contact plugs on both the source and the drain in a simultaneous manner, and to provide a method for fabricating the semiconductor device.

In accordance with one aspect, the present invention provides a semiconductor device including a metal oxide semiconductor field effect transistor having a source and a drain respectively being in contact with conduction layers, comprising: a contact plug being electrically insulated from a gate electrode of the transistor and being in electrical contact with the drain; a contact pad being electrically insulated from the gate electrode and being in electrical contact with the source; a first conduction wiring being in electrical contact with the contact plug; and a second conduction wiring being in electrical contact with the contact pad and being electrically insulated from the first conduction wiring.

In accordance with another aspect, the present invention provides a method for fabricating a semiconductor memory device including a metal oxide semiconductor field effect transistor, a capacitor being in contact with a source of the transistor, and a bit line being in contact with a drain of the transistor, comprising the steps of: forming an insulating film for an element isolation on a predetermined portion of a semiconductor substrate, forming a metal oxide semiconductor field effect transistor including a gate electrode, a source and a drain on a portion of the semiconductor substrate other than the predetermined portion, and then forming an insulating film and an insulating film spacer respectively on an upper surface of the gate electrode and each side surface of the gate electrode; forming a first etch barrier layer for the insulating film over the entire exposed surface of the resulting structure obtained after the formation of the insulating film and the insulating film spacer, and then forming a first insulating film for planarization over the first etch barrier layer; forming contact holes for exposing the source and the drain, respectively; depositing a conduction layer over the entire exposed surface of the resulting structure obtained after the formation of the contact holes; etching selected portions of the conduction layer, thereby forming a contact pad and a contact plug respectively on the contact hole for exposing the drain and on the contact hole for exposing the source; forming a second insulating film over the entire exposed surface of the resulting structure obtained after the formation of the contact pad and the contact plug, and then forming a contact hole for exposing the contact pad; forming a conduction layer for the bit line and a third insulating film over the entire exposed surface of the resulting structure obtained after the formation of the contact hole for exposing the contact pad, and then etching respective predetermined portions of the third insulating film and the bit line by use of an etch process using a bit line mask, thereby forming the bit line; forming an insulating film spacer on each side wall of the bit line; forming a second etch barrier layer over the entire exposed surface of the resulting structure obtained after the formation of the insulating film spacer, and then forming a fourth insulating film for planarization over the second etch barrier layer; forming a contact hole for exposing the contact plug; forming a storage electrode being in contact with the contact plug; and forming a dielectric film and a plate electrode on the storage electrode.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
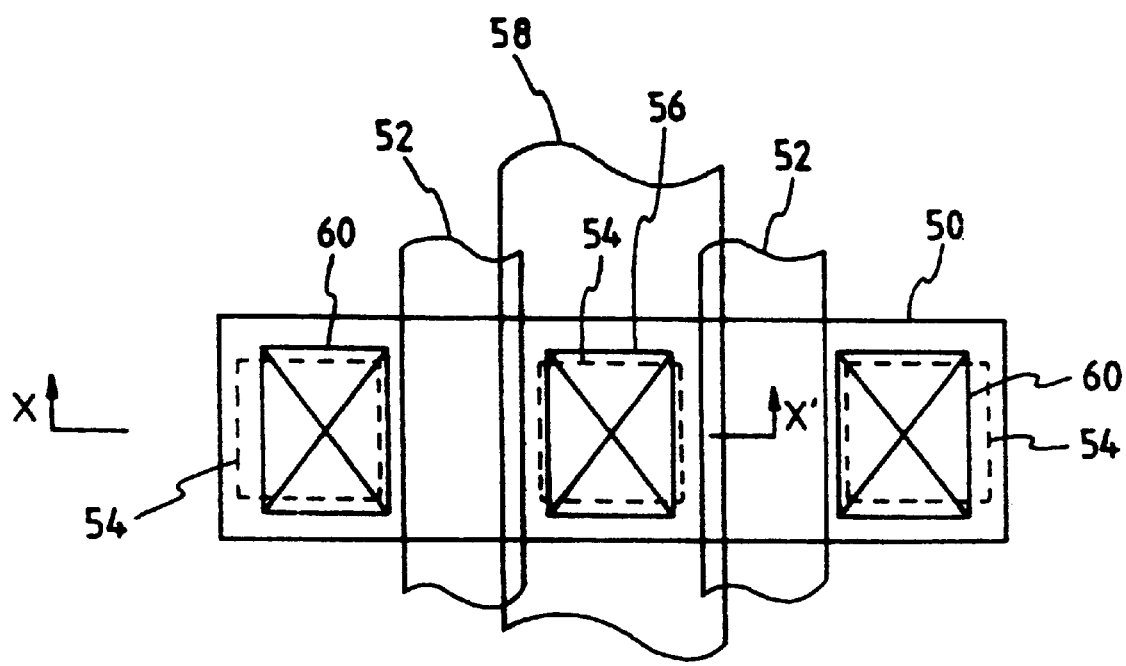
FIG. 1 is a plan view illustrating a layout of a conventional semiconductor device.
Figure 3:
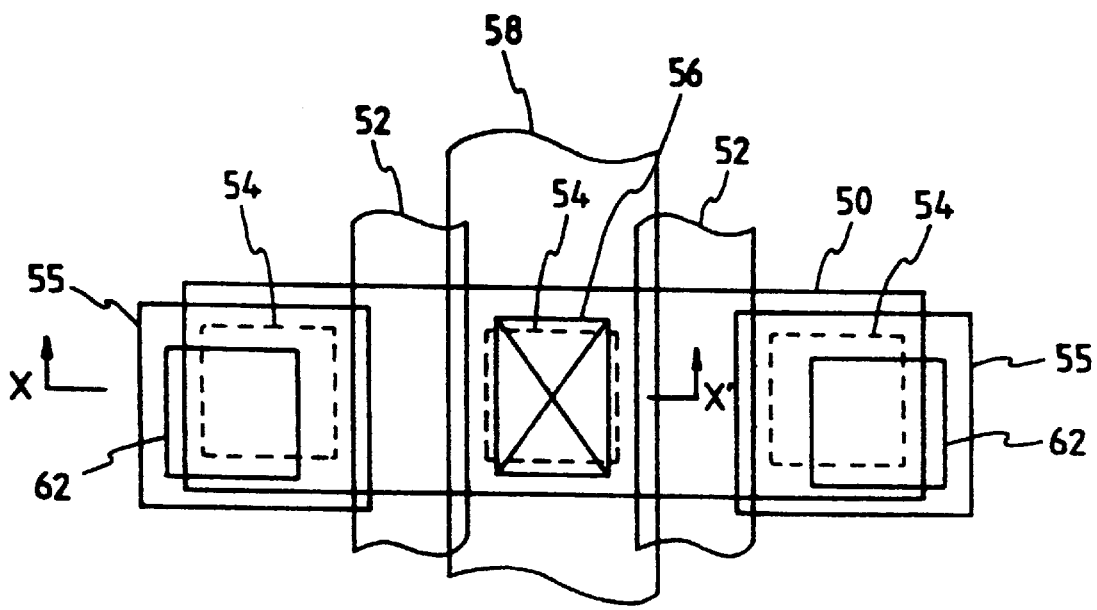
FIG. 3 is a plan view illustrating a layout of a semiconductor device in accordance with an embodiment of the present invention.

FIG. 3 shows a layout of a MOSFET with a contact structure in accordance with an embodiment of the present invention. In FIG. 3, the MOSFET structure is shown in symmetry to its drain. In FIG. 3, elements respectively corresponding to those in FIG. 1 are denoted by the same reference numerals. As shown in FIG. 3, the MOSFET includes an active mask 50, a word line mask 52, a source/drain contact mask 54, a contact pad mask 55, a drain contact mask 56, a first conduction wiring mask 58 and a source contact mask 62.

FIGS. 4A to 4F are cross-sectional views respectively taken along the line X–X' of FIG. 3, showing a method for forming a contact plug on a drain of the MOSFET structure, forming a contact pad on a source of the MOSFET structure and forming a conduction layer for contacts. In FIGS. 4A to 4F, elements respectively corresponding to those in FIGS. 2A to 2F are denoted by the same reference numerals.

Figure 4A:
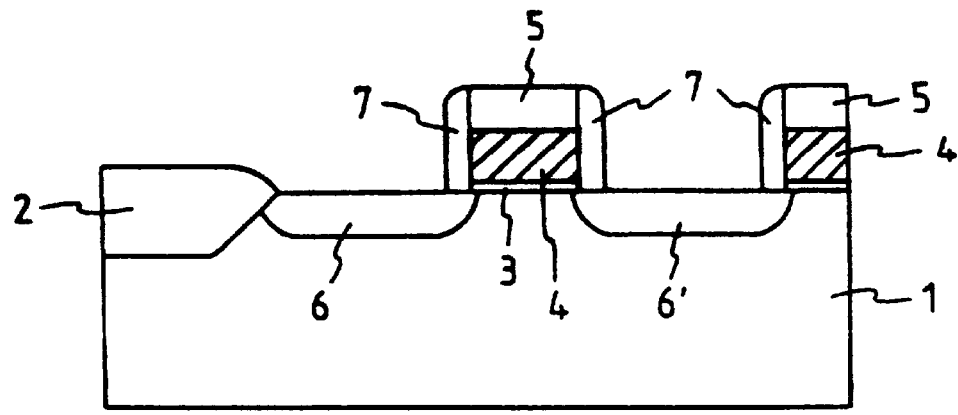
FIGS. 4A to 4F are sectional views respectively illustrating a method for forming contact plugs respectively on a source and a drain of a MOSFET and bring a conduction wiring into contact with each of the contact plug in accordance with the present invention.
Figure 4B:
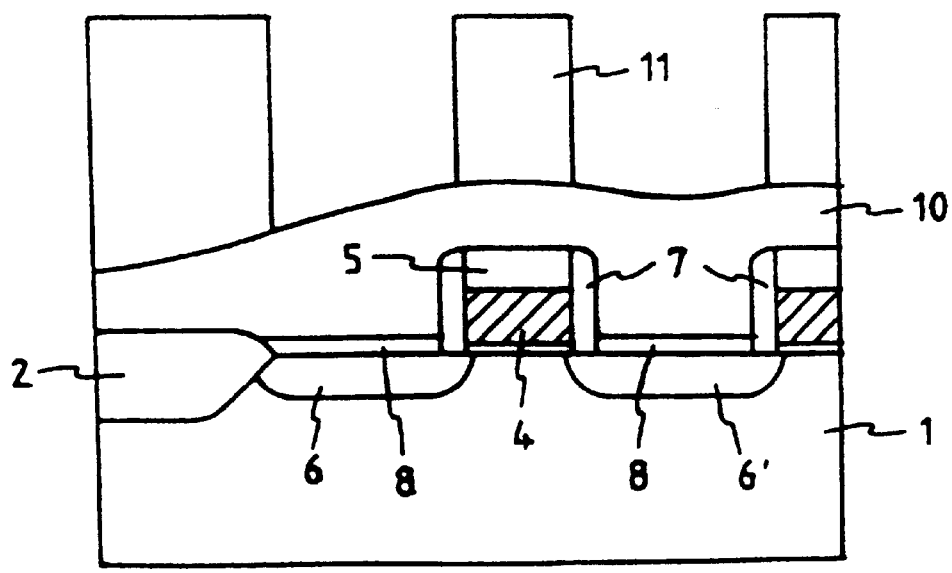

In accordance with this method, first, an insulating film 2 for an element isolation is formed on a predetermined portion of a semiconductor substrate 1, as shown in FIG. 4A. On the other portion of the semiconductor substrate 1, a MOSFET is then formed to include a gate oxide film 3, gate electrodes 4, a source 6 and a drain 6'. Thereafter, an insulating film 5 and insulating film spacers 7 axe formed on the upper surface and side surfaces of each gate electrode 4, respectively. The insulating film 5 is comprised of an oxide film.

Figure 2A:
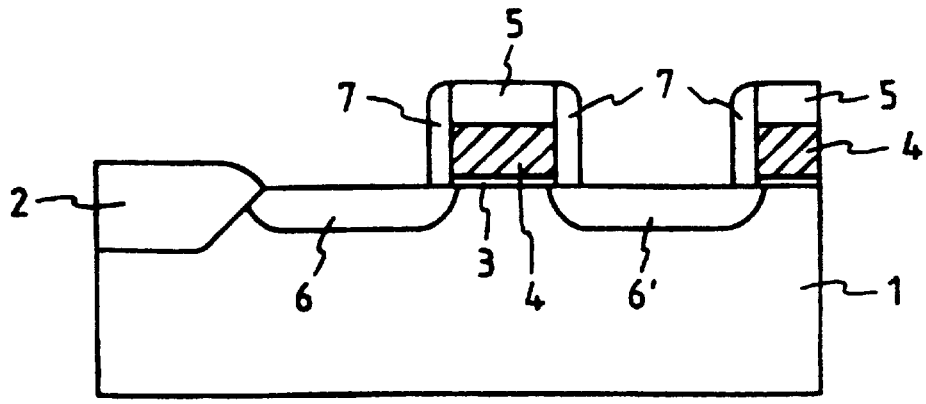
FIGS. 2A to 2F are sectional views respectively illustrating a conventional method for forming contact plugs respectively on a source and a drain of a MOSFET and bring a conduction wiring into contact with each of the contact plug.
Figure 2B:
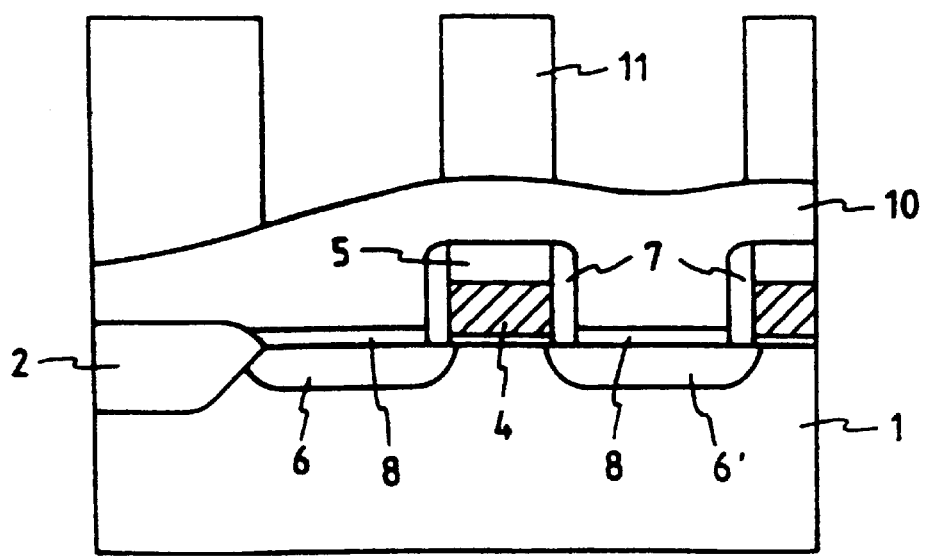
Figure 2C:
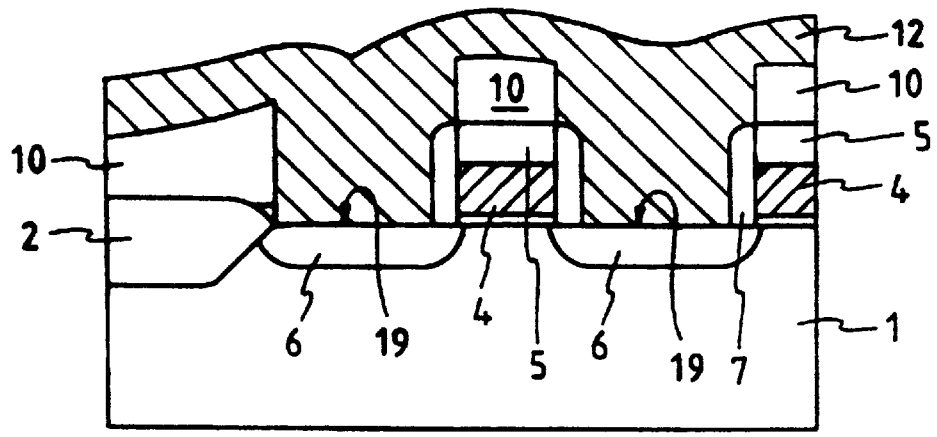
Figure 2D:
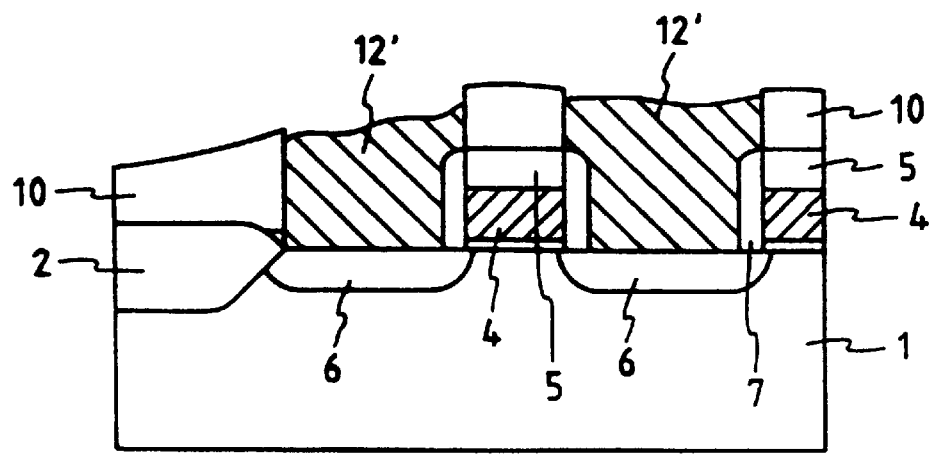
Figure 2E:
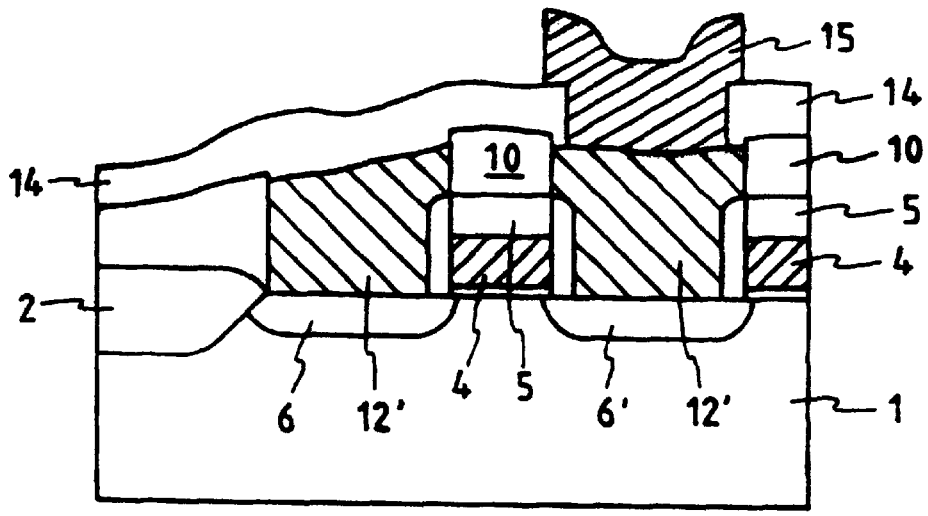
Figure 2F:
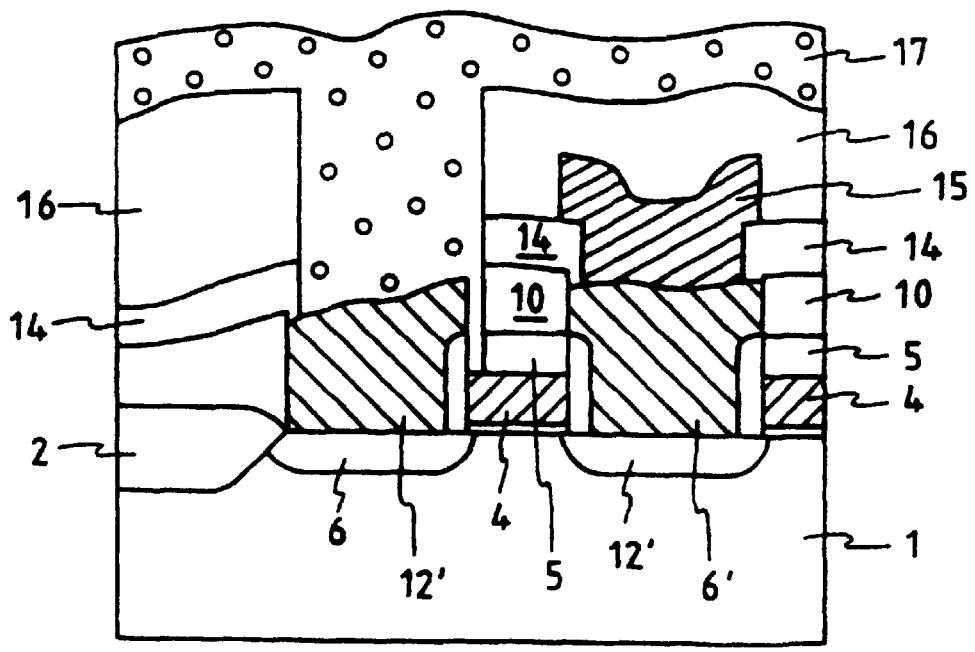

A thin oxide film 8 is then formed on the exposed source and drain 6 and 6', as shown in FIG. 2B. Over the entire exposed surface of the resulting structure, a first insulating film 10 for planarization is formed. The first insulating film 10 is comprised of, for example, a BPSG film. Using a source/drain contact mask such as the mask 54 of FIG. 3, the formation of a photoresist film pattern 11 is then carried out.

Figure 4C:
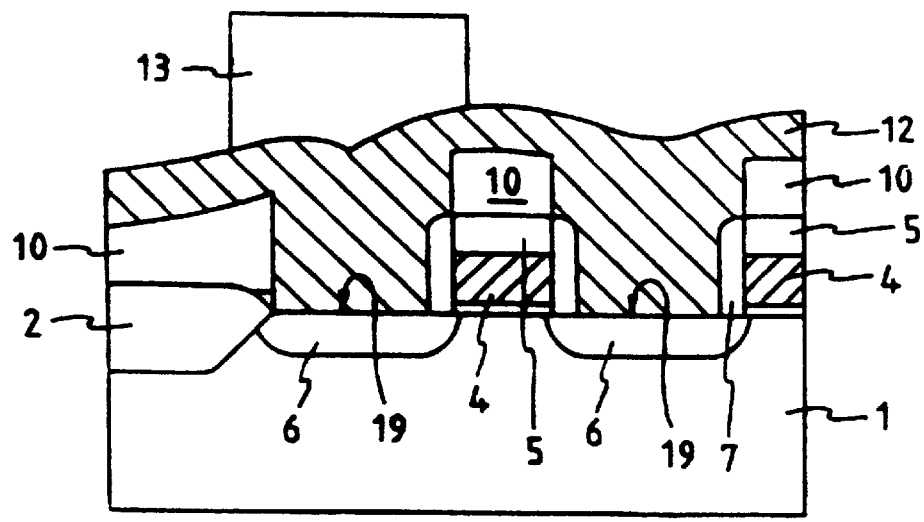

Using the photoresist film pattern 11 as a mask, exposed portions of the first insulating film 10 are then etched, as shown in FIG. 4C. Subsequently, the thin oxide film 8 exposed after the etching of the first insulating film 10 is anisotropically etched, thereby forming contact holes 19 through which the source 6 and the drain 6' are exposed, respectively. The contact holes 19 are formed in a self-aligned manner by virtue of the insulating spacers 7. Thereafter, the photoresist film pattern 11 is removed. Over the entire exposed surface of the resulting structure, a conduction layer 12 is formed to a sufficient thickness so that it is buried in the contact holes 19. A photoresist film is then coated over the entire exposed surface of the resulting structure. Using a contact pad mask such as the mask 55 of FIG. 3, the photoresist film is subjected to light exposure and development, thereby forming a photoresist film pattern 13.

Figure 4D:
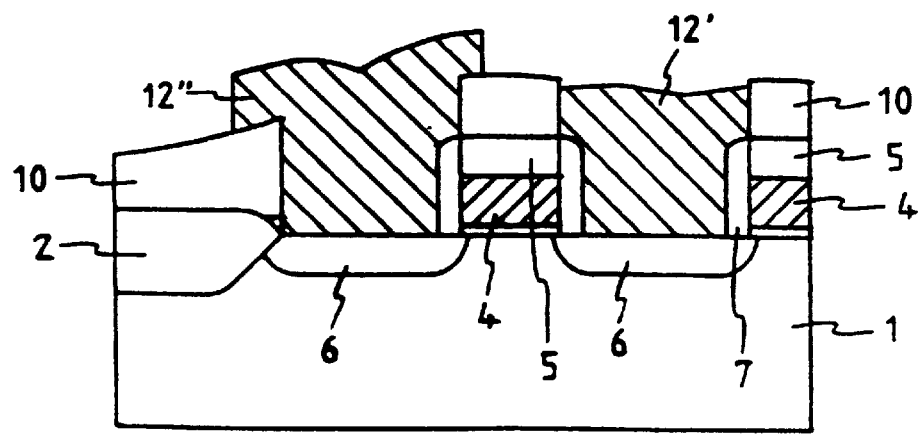

Using the photoresist film pattern 13 as a mask, the conduction layer 12 is then fully etched until the upper surface of the first insulating film 10 is exposed, as shown in FIG. 4D. As a result, the remaining portions of the conduction layer 12 form a contact plug 12' and a contact pad 12" respectively buried in the contact holes 19. The contact pad 12" has an upper portion partially overlapping with a portion of the first insulating film 10 surrounding the corresponding contact hole 19.

Figure 4E:
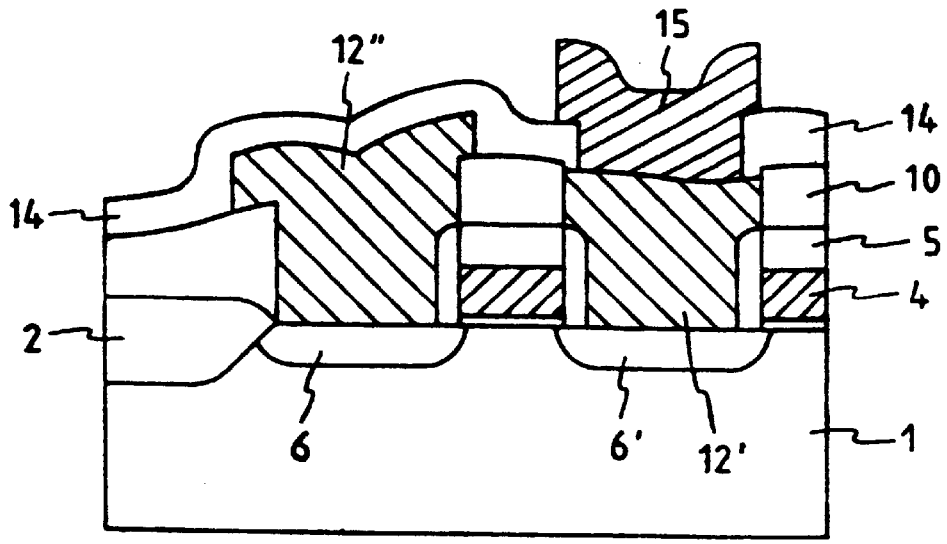

Over the entire exposed surface of the resulting structure, a second insulating film 14 is then formed to a predetermined thickness, as shown in FIG. 4E. Thereafter, the second insulating film 14 is subjected to an etch process using a drain contact mask such as the mask 56 of FIG. 3 so that the contact plug 12' is exposed. Over the entire exposed surface of the resulting structure, a first conduction layer is deposited. The first conduction layer is then subjected to an etch process using a first conduction wiring mask such as the mask 58 of FIG. 3, thereby forming a first conduction wiring 15. Since the second insulating film 14 has a small thickness, it is not short-circuited with the gate electrode 4 even at a left misaligned state of the first conduction wiring mask. This is because the first insulating film 10 disposed beneath the second insulating film 14 is incompletely etched even when an overetch of the second insulating film 14 is generated.

Figure 4F:
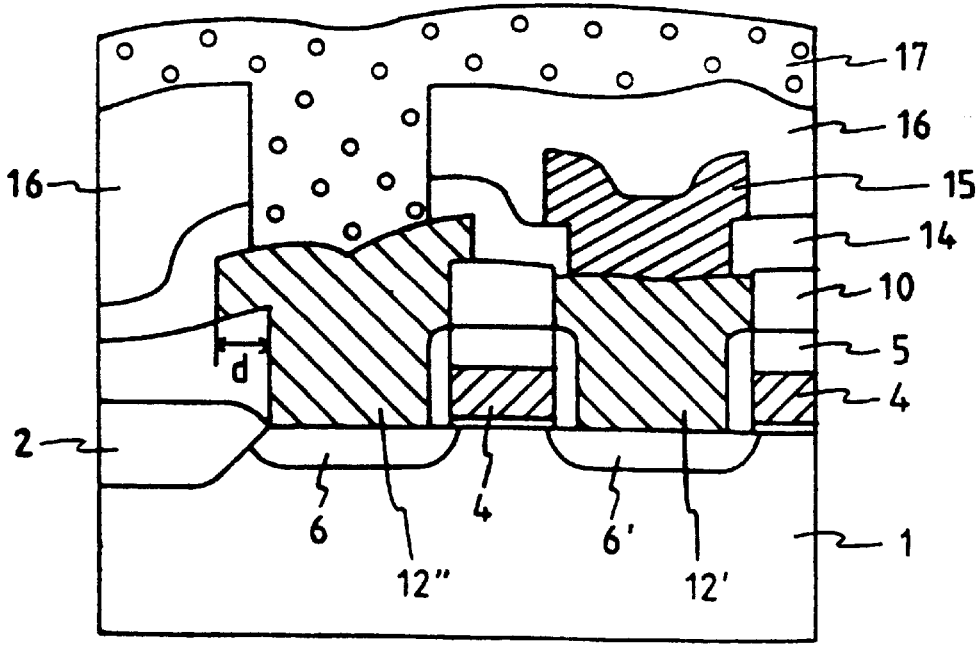

A third insulating film 16 is then formed over the entire exposed surface of the resulting structure, as shown in FIG. 4F. Using a source contact mask such as the mask 62 of FIG. 3, the third insulating film 16 is then etched so as to form a contact hole through which the contact pad 12" is exposed. Thereafter, formation of a second conduction wiring 17 being in contact with the contact pad 12" is carried out. By referring to FIG. 4F, it can be found that an alignment margin corresponding to the increased width d of the contact pad 12" is given upon arranging the source contact mask, namely, the mask 62 of FIG. 3, thereby preventing the first insulating film 10 from being etched. Accordingly, it is possible to prevent the second conduction wiring 17 from being short-circuited with other conduction films.

Since the contacts are formed using the contact pad and the contact plug, as mentioned above, it is possible to stably bring the conduction layer into contact with the semiconductor substrate while minimizing the area of the semiconductor device.

Figure 5:
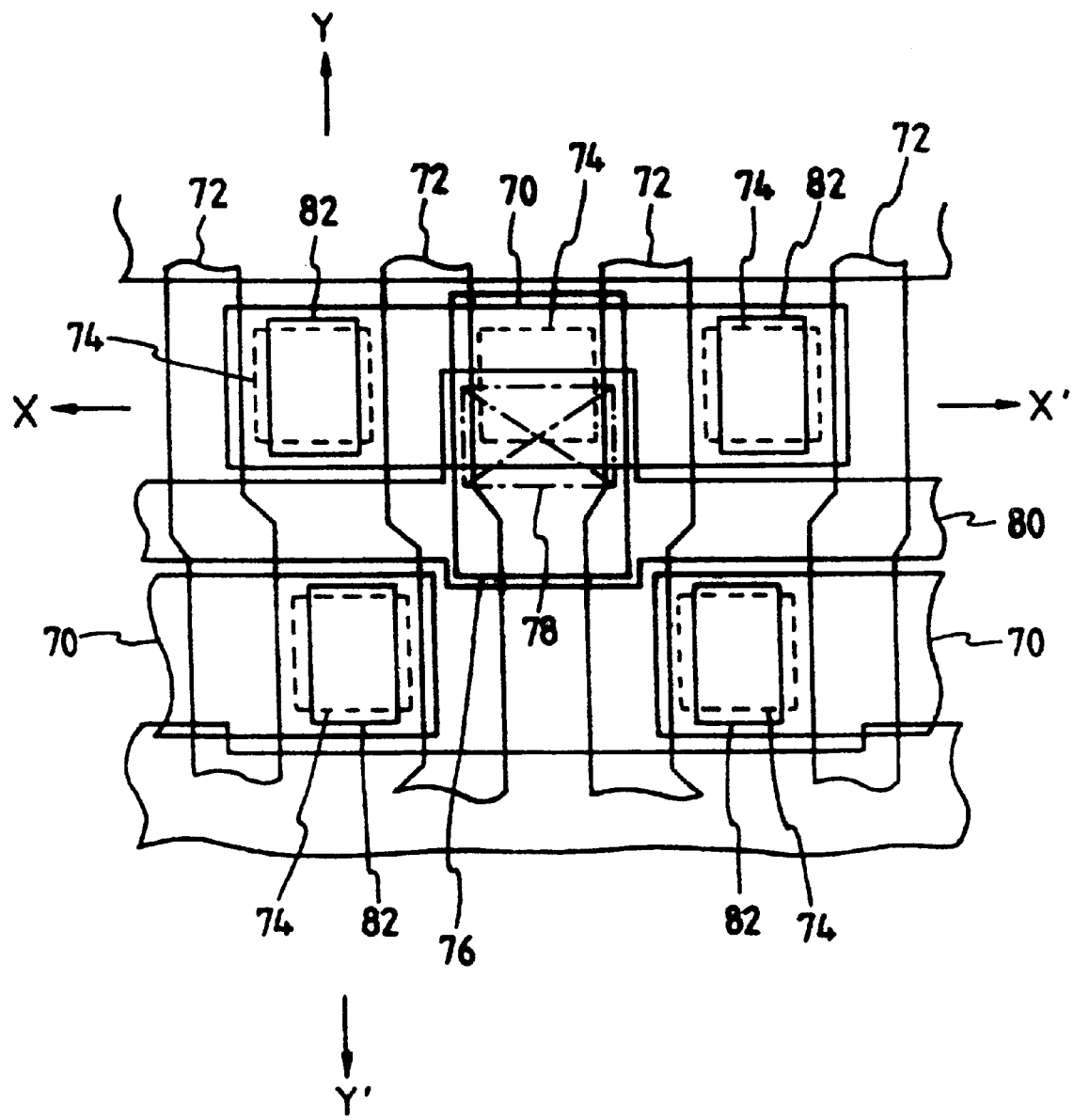
FIG. 5 is a plan view illustrating a layout of a semiconductor memory device in accordance with another embodiment of the present invention.

FIG. 5 shows a layout of a dynamic random access memory (DRAM) with a structure having a contact pad and contact plugs in accordance with another embodiment of the present invention. As shown in FIG. 5, the DRAM includes an active mask 70, a word line mask 72, a source/drain contact mask 74, a contact pad mask 76, a bit line contact mask 78, a bit line mask 80 and a storage electrode contact mask 82.

FIGS. 6A to 6I are cross-sectional views respectively taken along the line X–X' of FIG. 5, showing a method for fabricating a semiconductor memory device provided with a contact pad and a contact plug in accordance with the present invention.

On the other hand, FIGS. 7A to 7D are cross-sectional views respectively taken along the line Y–Y' of FIG. 5 and corresponding to FIGS. 6F to 6I.

Figure 6A:
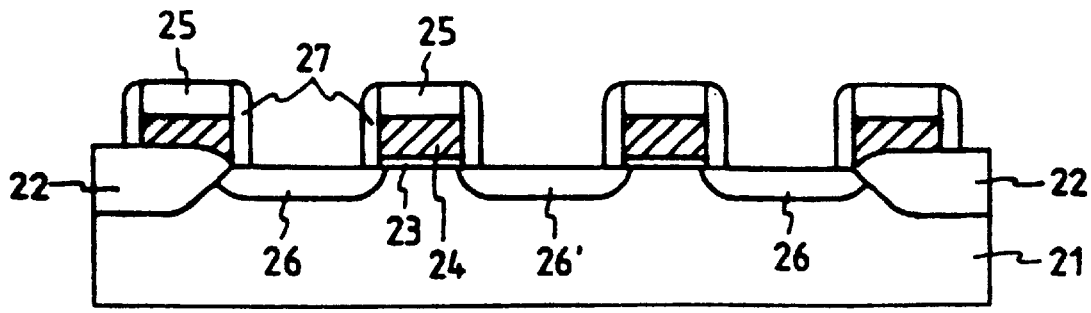
FIGS. 6A to 6I are sectional views respectively illustrating a method for fabricating a semiconductor memory device provided with a contact pad and contact plugs in accordance with the present invention and being taken along the line X–X' of FIG. 5.

In accordance with this method, first, an insulating film 22 for an element isolation is formed on a predetermined portion of a semiconductor substrate 21, as shown in FIG. 6A. Formed on the other portion of the semiconductor substrate 21 are a gate oxide film 23, gate electrodes 24, sources 26 and a drain 26'. Thereafter, an insulating film 25 and insulating film spacers 27 are formed on the upper surface and side surfaces of each gate electrode 24, respectively.

Figure 6B:
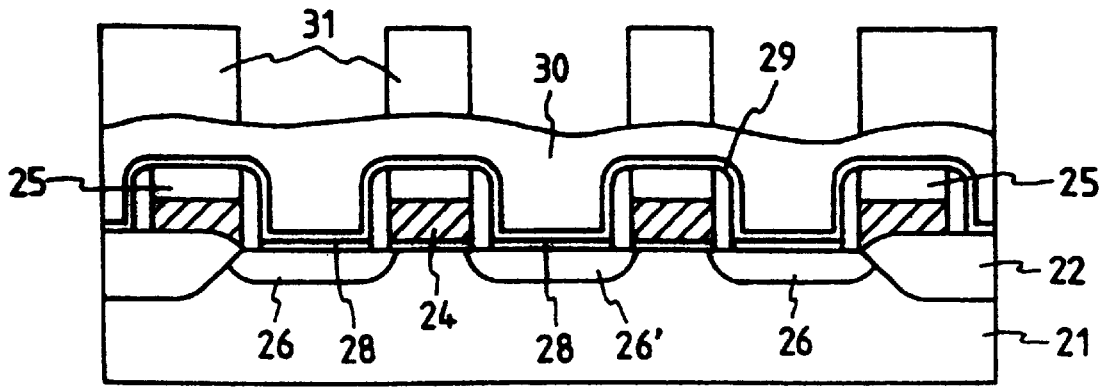

A thin oxide film 28 is then formed on exposed portions of the semiconductor substrate 21, as shown in FIG. 6B. Over the entire exposed surface of the resulting structure, an etch barrier layer 29 for an interlayer insulation is then formed. A first insulating film 30 for planarization is formed over the etch barrier layer 29. Thereafter, a photoresist film is coated over the first insulating film 30. Using a source/drain contact mask such as the mask 74 of FIG. 5, the photoresist film is then subjected to light exposure and development, thereby forming a photoresist film pattern 31.

Figure 6C:
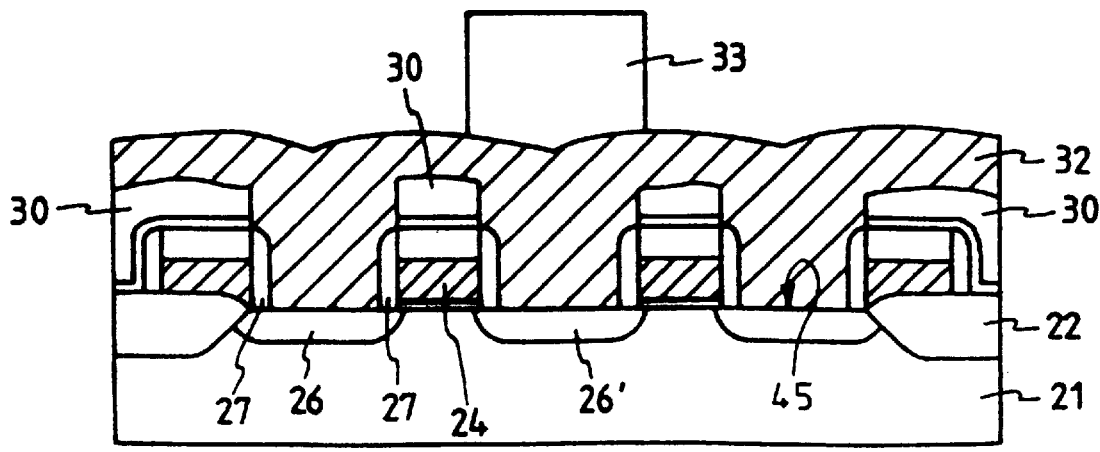

Using the photoresist film pattern 31 as a mask, exposed portions of the first insulating film 30 are then etched until the etch barrier layer 29 disposed beneath the first insulating film 30 is exposed, as shown in FIG. 6C. Subsequently, exposed portions of the etch barrier layer 29 and the thin oxide film 28 are anisotropically etched, thereby forming contact holes 45 through which the sources 26 and the drains 26' are exposed, respectively. Thereafter, the photoresist film pattern 31 is removed. Over the entire exposed surface of the resulting structure, a conduction layer 32 is formed to a sufficient thickness so that it is buried in the contact holes 45. A photoresist film is then coated over the conduction layer 32. Using a contact pad mask such as the mask 76 of FIG. 5, the photoresist film is subjected to light exposure and development, thereby forming a photoresist film pattern 33. The conduction layer 32 may be made of polysilicon or amorphous silicon.

Figure 6D:
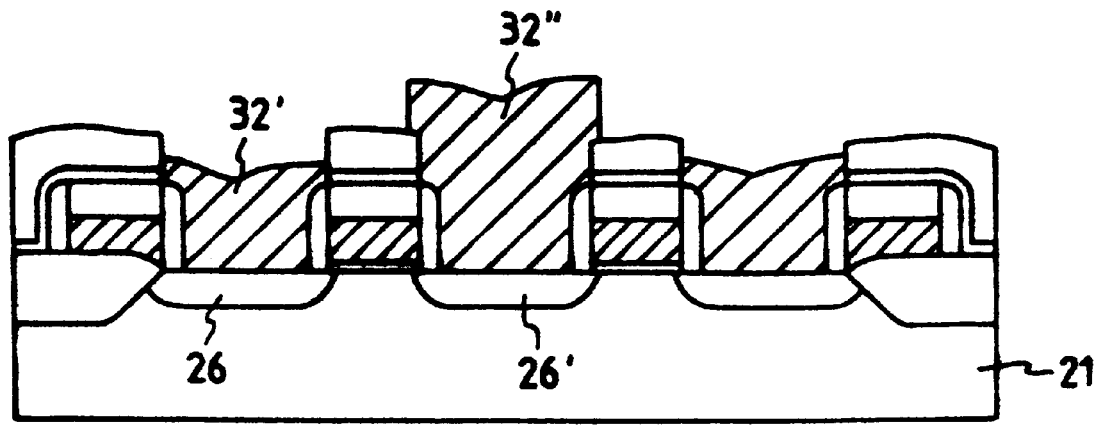

Using the photoresist film pattern 33 as a mask, the conduction layer 32 is then etched until the upper surface of the first insulating film 30 is exposed, as shown in FIG. 6D. As a result, the remaining portions of the conduction layer 12 form a contact plug 32' being in contact with each source 26 and a contact pad 32" being in contact with each drain 26'. Thereafter, the photoresist film pattern 33 is removed.

Figure 6E:
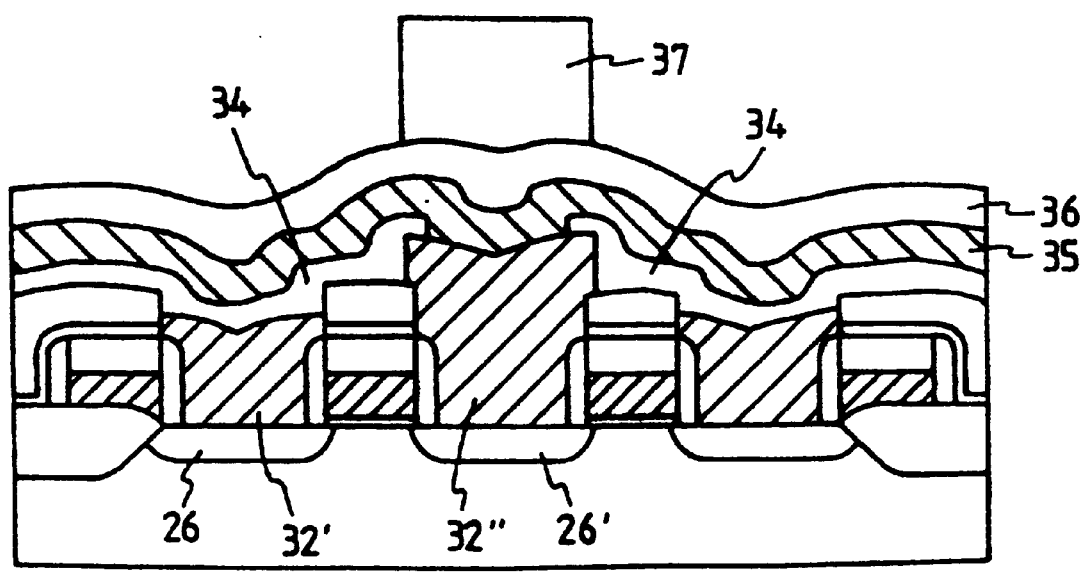

Over the entire exposed surface of the resulting structure, a second insulating film 34 is then formed to a predetermined thickness, as shown in FIG. 6E. Thereafter, the second insulating film 34 is subjected to an etch process using a bit line contact mask such as the mask 78 of FIG. 5, thereby forming a contact hole for exposing the contact pad 32". Over the entire exposed surface of the resulting structure, a conduction layer 35 for bit line and a third insulating film 36 are then formed. A photoresist film is then coated over the third insulating film 36. Using a bit line mask such as the mask 80 of FIG. 5, the photoresist film is subjected to light exposure and development, thereby forming a photoresist film pattern 37.

Figure 6F:
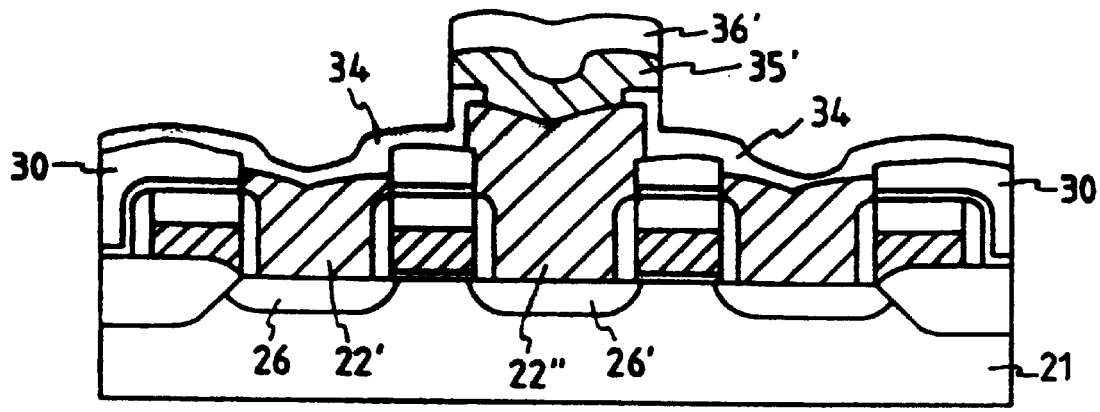
Figure 7A:
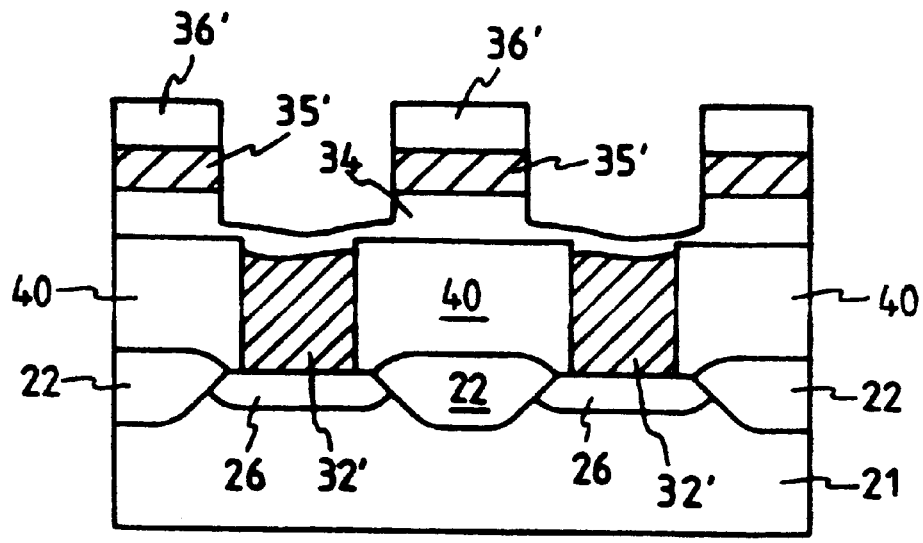
FIGS. 7A, to 7D are sectional views respectively corresponding to FIGS. 6F to 6I and being taken along the line Y–Y' of FIG. 5.

Using the photoresist film pattern 37 as a mask, the third insulating film 36 and the conduction layer 35 are then etched, thereby partially exposing the second insulating film 34, as shown in FIGS. 6F and 7A. The exposed portions of the second insulating film 34 are then etched to a predetermined depth, thereby forming a third insulating film pattern 36' and a bit line 35'. Subsequently, the photoresist film pattern 37 is removed.

Figure 6G:
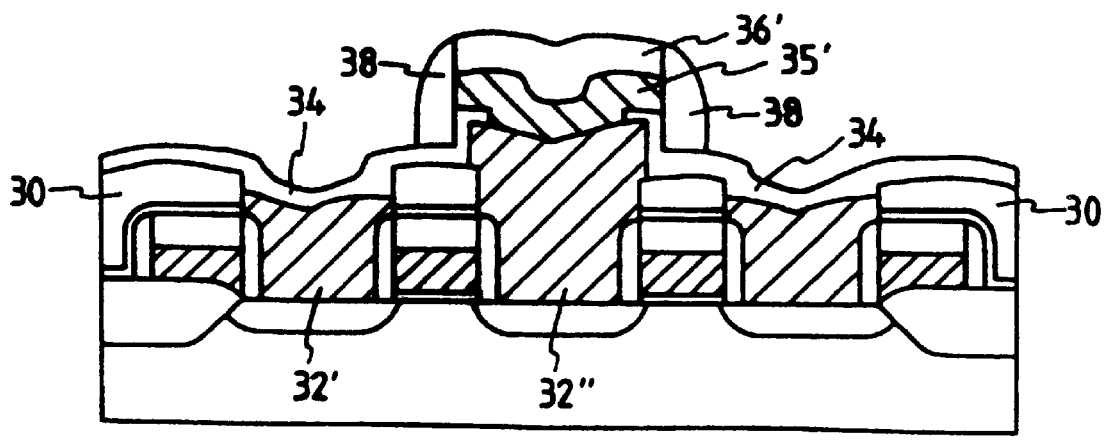
Figure 7B:
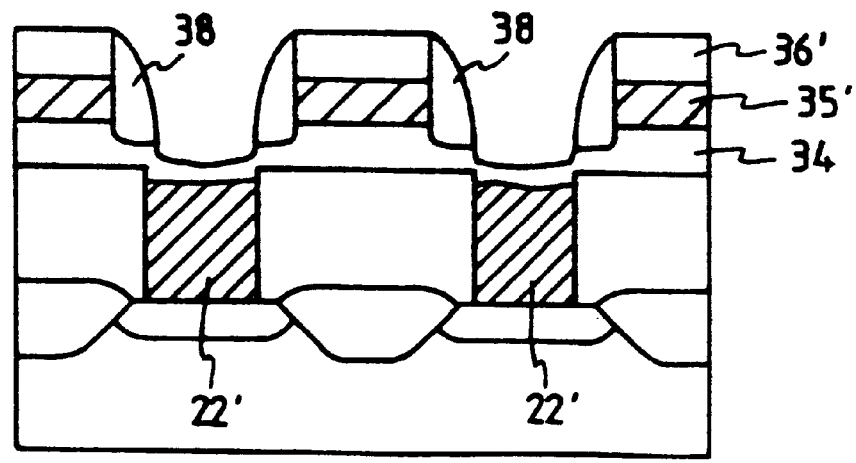

Thereafter, formation of insulating film spacers 38 covering side walls of the bit line 35' and third insulating film pattern 36' is carried out, as shown in FIGS. 6G and 7B.

Figure 6H:
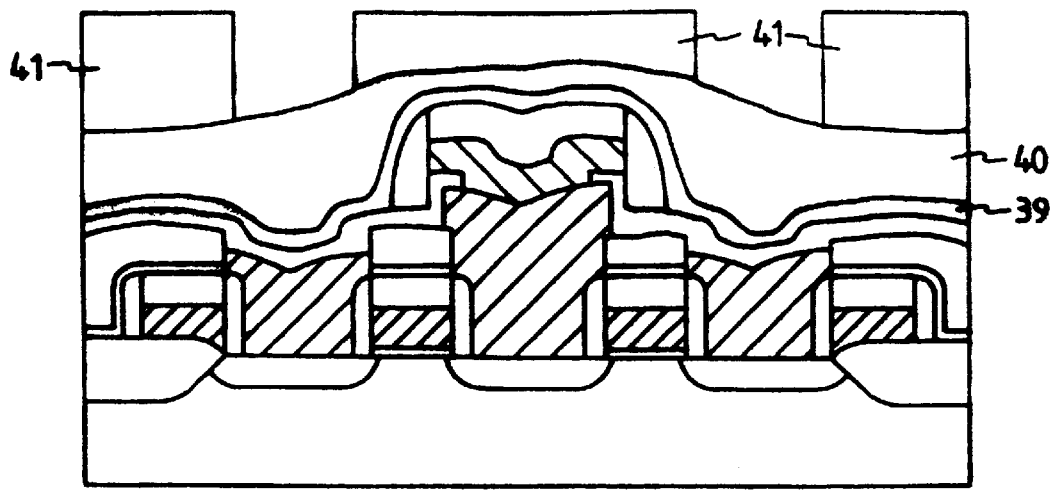
Figure 7C:
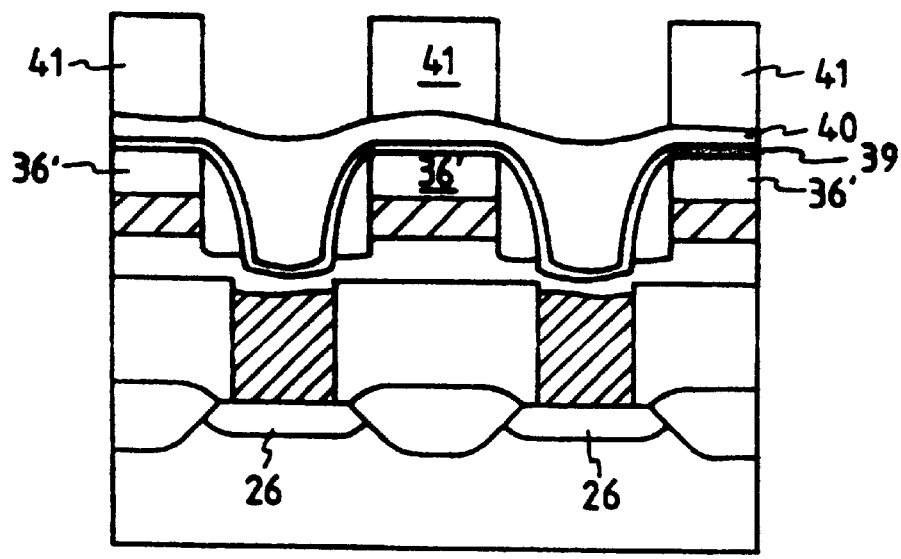

Over the entire exposed surface of the resulting structure, an etch barrier layer 39 is then formed, as shown in FIGS. 6H and 7C. A fourth insulating film 40 for planarization is then formed over the etch barrier layer 39. Over the fourth insulating film 40, a photoresist film is then coated. Subsequently, the photoresist film is subjected to light exposure and development, thereby forming a photoresist film pattern 41.

Figure 6I:
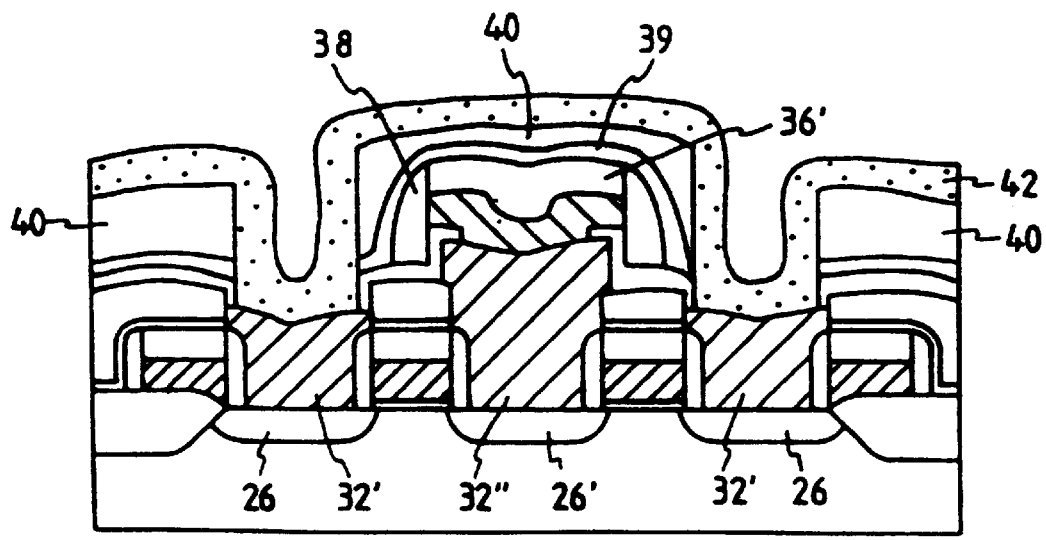
Figure 7D:
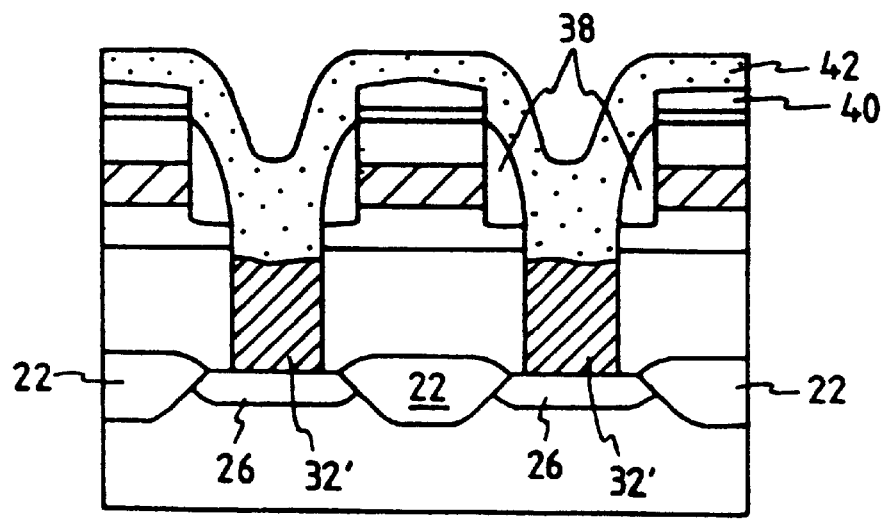

Using the photoresist film pattern 41 as a mask, the fourth insulating film 40 is then etched until the etch barrier layer 39 disposed beneath the fourth insulating film 40 is exposed, as shown in FIGS. 6I and 7D. Continuously, the exposed portions of the etch barrier layer 39 and portions of the second insulating film 34 disposed beneath the exposed portions of the etch barrier layer 39 are etched, thereby forming a contact hole through which each corresponding one of the contact plugs 32' is exposed. Thereafter, a conduction layer 42 for storage electrode is deposited over the entire exposed surface of the resulting structure such that it is in electrical contact with the sources 26. Over the conduction layer 42, a pattern for storage electrode is then formed. Using the pattern for storage electrode as a mask, formation of a storage electrode is carried out. Finally, a dielectric film and a plate electrode are formed on the storage electrode. Thus, a capacitor structure is obtained.

As apparent from the above description, the present invention provides a semiconductor device having a MOSFET structure capable of minimizing the area of the semiconductor device by forming a contact plug and a contact pad respectively on a drain and a source of the MOSFET. By virtue of the contact pad structured in accordance with the present invention, a sufficient alignment margin for a contact mask can be given upon bringing conduction layers respectively into contact with the contact pad and the contact plug.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device including a metal oxide semiconductor field effect transistor having a source and a drain respectively being in contact with conduction layers, comprising the steps of:

forming an insulating film for an element isolation on a first portion of a semiconductor substrate, forming a metal oxide semiconductor field effect transistor including a gate electrode, a source and a drain on a second portion of the semiconductor substrate other than the first portion, and then forming an insulating film and an insulating film spacer respectively on an upper surface of the gate electrode and each side surface of the gate electrode;

forming a first insulating film for planarization over the entire exposed surface of the resulting structure obtained after the formation of the insulating film on the upper surface of the gate electrode and the insulating film spacer, and then forming contact holes for exposing the source and the drain, respectively;

depositing a conduction layer over the entire exposed surface of the resulting structure obtained after the formation of the contact holes;

forming from the conduction layer a contact pad and a contact plug respectively on the contact hole for exposing the source and on the contact hole for exposing the drain by use of an etch process using a contact pad mask the contact plug having a surface substantially planar with an upper portion of the first insulating film for planarization and the contact pad having an upper edge of the contact pad overlapping adjacent portions of the first insulating film surrounding the contact hole;

forming a second insulating film over the entire exposed surface of the resulting structure obtained after the formation of the contact pad and the contact plug, forming a contact hole for exposing the contact plug, and then forming a first conduction wiring being in contact with the contact plug; and forming a third insulating film over the entire exposed surface of the resulting structure obtained after the formation of the first conduction wiring, forming a contact hole for exposing the contact pad, and then forming a second conduction wiring being in contact with the contact pad.

2. A method in accordance with claim 1, wherein a drain contact mask is used at the step of forming the contact hole for exposing the contact plug.

3. A method in accordance with claim 1, wherein a source contact mask is used at the step of forming the contact hole for exposing the contact pad.

4. A method in accordance with claim 1, wherein both the contact plug and the contact pad are comprised of a polysilicon layer or an amorphous silicon layer.

5. A method for fabricating a semiconductor memory device including a metal oxide semiconductor field effect transistor, a capacitor being in contact with a source of the transistor, and a bit line being in contact with a drain of the transistor, comprising the steps of:

forming an insulating film for an element isolation on a first portion of a semiconductor substrate, forming a metal oxide semiconductor field effect transistor including a gate electrode, a source and a drain on a second portion of the semiconductor substrate other than the first portion, and then forming an insulating film and an insulating film spacer respectively on an upper surface of the gate electrode and on each side surface of the gate electrode;

forming a first etch barrier layer for the insulating film on the upper surface of the gate electrode over the entire exposed surface of the resulting structure obtained after the formation of the insulating film on the upper surface of the gate electrode and the insulating film spacer, and then forming a first insulating film for planarization over the first etch barrier layer;

forming contact holes for exposing the source and the drain, respectively;

depositing a conduction layer over the entire exposed surface of the resulting structure obtained after the formation of the contact holes;

etching selected portions of the conduction layer, thereby forming a contact pad and a contact plug respectively on the contact hole for exposing the drain and on the contact hole for exposing the source the contact plug having a surface substantially planar with an upper portion of the first insulating film for planarization and the contact pad having an upper edge of the contact pad overlapping adjacent portions of the first insulating film surrounding the contact hole;

forming a second insulating film over the entire exposed surface of the resulting structure obtained after the formation of the contact pad and the contact plug, and then forming a contact hole for exposing the contact pad;

forming a conduction layer for the bit line and a third insulating film over the entire exposed surface of the resulting structure obtained after the formation of the contact hole for exposing the contact pad, and then etching respective portions of the third insulating film and the conductiion layer for the bit line by use of an etch process using a bit line mask, thereby forming the bit line;

forming an insulating film spacer on each side wall of the bit line;

forming a second etch barrier layer over the entire exposed surface of the resulting structure obtained after the formation of the insulating film spacer on each sidewall of the bit line, and then forming a fourth insulating film for planarization over the second etch barrier layer;

forming a contact hole for exposing the contact plug;

forming a storage electrode being in contact with the contact plug; and forming a dielectric film and a plate electrode on the storage electrode.

6. A method in accordance with claim 5, wherein both the contact pad and the contact plug are comprised of a polysilicon layer or an amorphous silicon layer.

7. A method in accordance with claim 5, wherein the step of forming the contact hole for exposing the contact plug comprises the steps of:

etching the fourth insulating film under a condition that a contact mask for the storage electrode is used until the second etch barrier layer is exposed;

etching an exposed portion of the second etch barrier layer, thereby partially exposing the second insulating film; and etching the exposed portion of the second insulating film, thereby forming the contact hole for exposing the contact plug.

\* \* \* \* \*